United States Patent
Cianfrocco

(10) Patent No.: US 11,018,573 B2
(45) Date of Patent: May 25, 2021

(54) POWER SUPPLY RIPPLE DETECTOR

(71) Applicant: Tyco Fire & Security GmbH, Neuhausen am Rheinfall (CH)

(72) Inventor: Daniel Paul Cianfrocco, Clinton, MA (US)

(73) Assignee: Johnson Controls Fire Protection LP, Boca Raton, FL (US)

(*) Notice: Subject to any disclaimer, the term of this patent is extended or adjusted under 35 U.S.C. 154(b) by 95 days.

(21) Appl. No.: 15/838,898

(22) Filed: Dec. 12, 2017

(65) Prior Publication Data
US 2019/0181745 A1    Jun. 13, 2019

(51) Int. Cl.
| | |
|---|---|
| *H02M 1/15* | (2006.01) |
| *H02M 1/42* | (2007.01) |
| *H02M 7/48* | (2007.01) |
| *H02M 3/158* | (2006.01) |
| *G01R 31/40* | (2020.01) |

(Continued)

(52) U.S. Cl.
CPC .............. *H02M 1/15* (2013.01); *G01R 31/40* (2013.01); *G01R 31/42* (2013.01); *G08B 29/00* (2013.01); *H02M 1/4225* (2013.01); *H02M 1/4258* (2013.01); *H02M 3/1584* (2013.01); *H02M 7/48* (2013.01)

(58) Field of Classification Search
CPC .... H02M 1/15; H02M 1/4225; H02M 1/4258; H02M 3/1584; H02M 7/48; G01R 31/40; G01R 31/42; G01R 19/257; G01R 31/2884; G01R 31/3004; G01R 31/3181; G01R 31/31813; G08B 29/00
USPC .......................................... 324/764.01, 750.3
See application file for complete search history.

(56) References Cited

U.S. PATENT DOCUMENTS

| | | | |
|---|---|---|---|
| 4,234,920 A | 11/1980 | Van Ness et al. | |
| 5,437,040 A * | 7/1995 | Campbell | G01R 31/40 |
| | | | 713/340 |

(Continued)

FOREIGN PATENT DOCUMENTS

| | | |
|---|---|---|
| EP | 2762903 A1 | 6/2014 |
| GB | 2073514 | 10/1981 |

OTHER PUBLICATIONS

Communication, dated Jun. 17, 2019, from Europe Patent Application No. 18209988.7, filed on Dec. 4, 2018. 13 pages.

*Primary Examiner* — Tung X Nguyen
*Assistant Examiner* — Robert P Alejnikov, Jr.
(74) *Attorney, Agent, or Firm* — HoustonHogle LLP

(57) ABSTRACT

A system and method for power supply ripple detection is disclosed. A voltage across one or more capacitors of the power supply is measured. An AC ripple voltage component of the capacitor voltage is then filtered and rectified into a DC signal. A level of ripple represented by the DC signal is then compared to threshold values to assess a health of the power supply. In one implementation, the power supplies provide power to control panels of one or more building management systems. The power supplies determine and report information concerning health of the power supplies to the control panels, the information including the DC signal itself and the result of the comparison of the DC signal to the threshold values. A cloud-based connected services system then receives and analyzes the information concerning health of the power supplies forwarded from control panels of multiple building management systems to determine trends.

22 Claims, 7 Drawing Sheets

(51) Int. Cl.
*G01R 31/42* (2006.01)
*G08B 29/00* (2006.01)

(56) References Cited

U.S. PATENT DOCUMENTS

| | | |
|---|---|---|
| 6,249,220 B1 | 6/2001 | Kaji et al. |
| 2007/0001819 A1 | 1/2007 | Becker et al. |
| 2007/0075728 A1* | 4/2007 | Chang ................ G06F 1/26 324/764.01 |
| 2007/0103163 A1 | 5/2007 | Hachisuka et al. |
| 2009/0072984 A1* | 3/2009 | Cheng ................ G01R 31/40 340/653 |
| 2009/0073731 A1* | 3/2009 | Phadke ............... G01R 31/343 363/74 |
| 2010/0058092 A1 | 3/2010 | Bougaev et al. |
| 2010/0161259 A1* | 6/2010 | Kim ................ G05B 23/0283 702/63 |
| 2015/0153409 A1* | 6/2015 | Zhu ................... G01R 31/40 714/733 |
| 2017/0153296 A1 | 6/2017 | Engl et al. |
| 2017/0264493 A1* | 9/2017 | Cencini ............... G06F 1/189 |
| 2017/0328943 A1* | 11/2017 | McConnell .......... G01R 31/40 |
| 2020/0120163 A1* | 4/2020 | Gargi ................... H04L 41/22 |

* cited by examiner

POWER SUPPLY RIPPLE DETECTOR

BACKGROUND OF THE INVENTION

Building management systems, such as building automation systems, fire alarm systems and intrusion systems, are often installed within a premises such as commercial, residential, or governmental buildings. Examples of these buildings include offices, hospitals, warehouses, public infrastructure buildings including subways and bus terminals, multi-unit dwellings, schools or universities, shopping malls, government offices, and casinos.

Fire alarm systems typically include fire control panels that operate as system controllers. Fire detection/initiation devices and alarm notification devices are then installed, distributed throughout the buildings and connected to the panels. The distributed devices are typically connected to one or more loops. Some examples of fire detection/initiation devices include smoke detectors, carbon monoxide detectors, flame detectors, temperature sensors, and/or pull stations (also known as manual call points). Some examples of fire notification devices include speakers, horns, bells, chimes, light emitting diode (LED) reader boards, and/or flashing lights (e.g., strobes).

The fire detection devices monitor the buildings for indicators of fire. Upon detection of an indicator of fire such as smoke or heat or flames, the distributed device is activated and a signal is sent from the activated distributed device to the fire control panel. The fire control panel then initiates an alarm condition by activating audio and visible alarms of the fire notification devices of the fire alarm system, which are also distributed around the building. Additionally, the fire control panel will also send an alarm signal to a monitoring station, which will notify the local fire department or fire brigade.

Intrusion systems typically include intrusion panels and their own distributed devices. The distributed monitoring devices detect indications of intrusions, building security breaches and unauthorized access at or within the building and report to the intrusion panels. Examples of monitoring devices include motion sensor devices, door and window relays, thermal sensors, and surveillance camera devices that communicate with the intrusion panel over a security network. Motion sensor devices can detect intrusions and unauthorized access to the premises, and send indications of the intrusions to the security panel. The surveillance camera devices capture video data of monitored areas within the premises, in examples.

Building automation systems will typically include one or more building automation control panels and distributed devices that control and monitor the physical plant aspects of a building and aspects of business-specific electrical, computer, and mechanical systems. The physical plant typically includes heating, ventilation, and air conditioning (HVAC) systems, elevators/escalators, lighting and power systems, refrigeration and coolant systems, and air and/or water purification systems, in examples. HVAC systems typically include air handlers and systems of ducts and vents for circulating air throughout the building. Business-specific systems include computer systems, manufacturing systems that include various types of computer-aided machinery and test equipment, and inventory control and tracking systems, in examples.

The control panels of the building management systems are powered by power supplies. These supplies typically convert an alternating current (AC) power input from an AC mains/line voltage into a direct current (DC) output. The DC output provides power to the control panels. The power supplies can also provide power to the loops and the distributed devices that communicate with the control panels. Types of power supplies include linear power supplies that operate at an AC main line frequency (i.e. 50/60 Hz), and switching power supplies such as "DC to DC power supplies" that operate at a much higher operating frequency (typically 10 kHz-1 Mhz), in examples.

Power supplies for control panels are designed for high reliability. Many control panels have backup/secondary power supplies that provide power when a primary power supply fails. The life span of power supplies is typically measured in Mean Time Between Failures (MTBF). Power supplies are often designed with a MTBF of 100,000 hours under full load, or possibly more. Factors that influence the MTBF of a power supply (and therefore its expected life span) include whether the power supply is under a full or partial load during its operation, and whether adequate cooling is provided during its operation, in examples.

Recently, it has been proposed to use connected services systems to monitor building management systems. Connected services systems are remote systems that communicate with the building management systems and are sometimes administered by separate business entities than the owners and/or occupants of the buildings, which contain the building managements systems. For example, the connected services system can be administered by a building management system manufacturer and/or an entity providing service on the building management systems.

SUMMARY OF THE INVENTION

The present invention is directed towards building management systems that can monitor the health of their power supplies. Specifically, the proposed systems monitor the health of power supplies that provide power to control panels of the building management systems. For this purpose, a voltage across one or more capacitors of each power supply might be measured.

The control panels also forward information concerning the health of the power supplies to a connected services system. The connected services system then analyzes the information across multiple power supplies to determine trends, and executes statistical analysis upon the information. A technician can then use the analysis to determine trends across power supplies of multiple building management systems and to predict when power supplies may fail, in examples.

In general, according to one aspect, the invention features a power supply monitoring system. The system includes a bandpass filter for filtering a voltage across a capacitor of a power supply and a controller. The controller analyzes the capacitor voltage via the bandpass filter to assess a health of the power supply.

Preferably, the bandpass filter has a center frequency at an operating frequency of the power supply. The bandpass filter includes a first capacitor that blocks a DC bias of the capacitor voltage and passes an AC ripple voltage component of the capacitor voltage. The bandpass filter also produces a filtered ripple signal, and can additionally amplify the filtered ripple signal.

Additionally and/or alternatively, the bandpass filter includes a voltage divider and an amplifier. The voltage divider biases an AC ripple voltage component of the capacitor voltage to be at a center of an operating range of the amplifier.

The system also includes a rectifier and transient filter that receives a filtered ripple signal provided by the bandpass filter, and outputs a rectified ripple signal. The rectifier and transient filter typically includes two or more diodes. The rectifier and transient filter can additionally include a low pass filter that filters the rectified ripple signal to attenuate transients and/or surges within the rectified ripple signal.

Preferably, the controller analyzes the capacitor voltage via the bandpass filter to assess a health of the power supply, based upon a rectified ripple signal. The controller can also determine that the power supply is operating outside an acceptable operational state when a sampled rectified ripple signal is lower than a minimum threshold value and/or higher than a maximum threshold value.

In general, according to another aspect, the invention features a building management system. The building management includes a system panel for controlling the building management system, a power supply system for powering the system panel, and a power supply health monitoring system. The power supply health monitoring system obtains information concerning health of the power supply system and reports to the system panel.

The system can also include a connected services system that communicates with the system panel over a network. The system panel forwards the information concerning health of the power supply system, reported by the power supply health monitoring system, to the connected services system. The connected services system can also combine the information concerning health of the power supply system, with information concerning health of other power supply systems from system panels of other building management systems, and determine trends among the combined information concerning health of the power supply systems.

The information concerning health of the power supply system includes a sampled rectified ripple signal representing a level of ripple associated with the power supply system. Typically, the level of ripple associated with the power supply system is an AC ripple voltage component of a voltage across a capacitor of the power supply system.

Additionally and/or alternatively, the power supply health monitoring system can determine that the power supply system is operating outside an acceptable operational state, when a sampled rectified ripple signal representing a level of ripple associated with the power supply system is lower than a minimum threshold value and/or higher than a maximum threshold value.

In one example, the building management system is a fire alarm system, and the system panel is a fire alarm system control panel.

Additionally and/or alternatively, the system panel reports the information concerning health of the power supply system to a mobile computing device carried by a technician.

In general, according to yet another aspect, the invention features a power supply monitoring method. The method filters a voltage across a capacitor of a power supply to obtain a filtered ripple signal, rectifies the filtered ripple signal, and analyzes the rectified ripple signal. The method rectifies the filtered ripple signal to obtain a rectified ripple signal that represents a level of ripple of the capacitor voltage, and analyzes the rectified ripple signal to assess a health of the power supply.

In general, according to still another aspect, the invention features a method for monitoring a building management system. The method includes a system panel controlling the building management system, a power supply system providing power to the system panel, and obtaining and reporting information concerning health of the power supply system to the system panel.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

The invention now will be described more fully hereinafter with reference to the accompanying drawings, in which illustrative embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

As used herein, the term "and/or" includes any and all combinations of one or more of the associated listed items. Further, the singular forms and the articles "a", "an" and "the" are intended to include the plural forms as well, unless expressly stated otherwise. It will be further understood that the terms: includes, comprises, including and/or comprising, when used in this specification, specify the presence of stated features, integers, steps, operations, elements, and/or components, but do not preclude the presence or addition of one or more other features, integers, steps, operations, elements, components, and/or groups thereof. Further, it will be understood that when an element, including component or subsystem, is referred to and/or shown as being connected or coupled to another element, it can be directly connected or coupled to the other element or intervening elements may be present.

It will be understood that although terms such as "first" and "second" are used herein to describe various elements, these elements should not be limited by these terms. These terms are only used to distinguish one element from another element. Thus, an element discussed below could be termed a second element, and similarly, a second element may be termed a first element without departing from the teachings of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
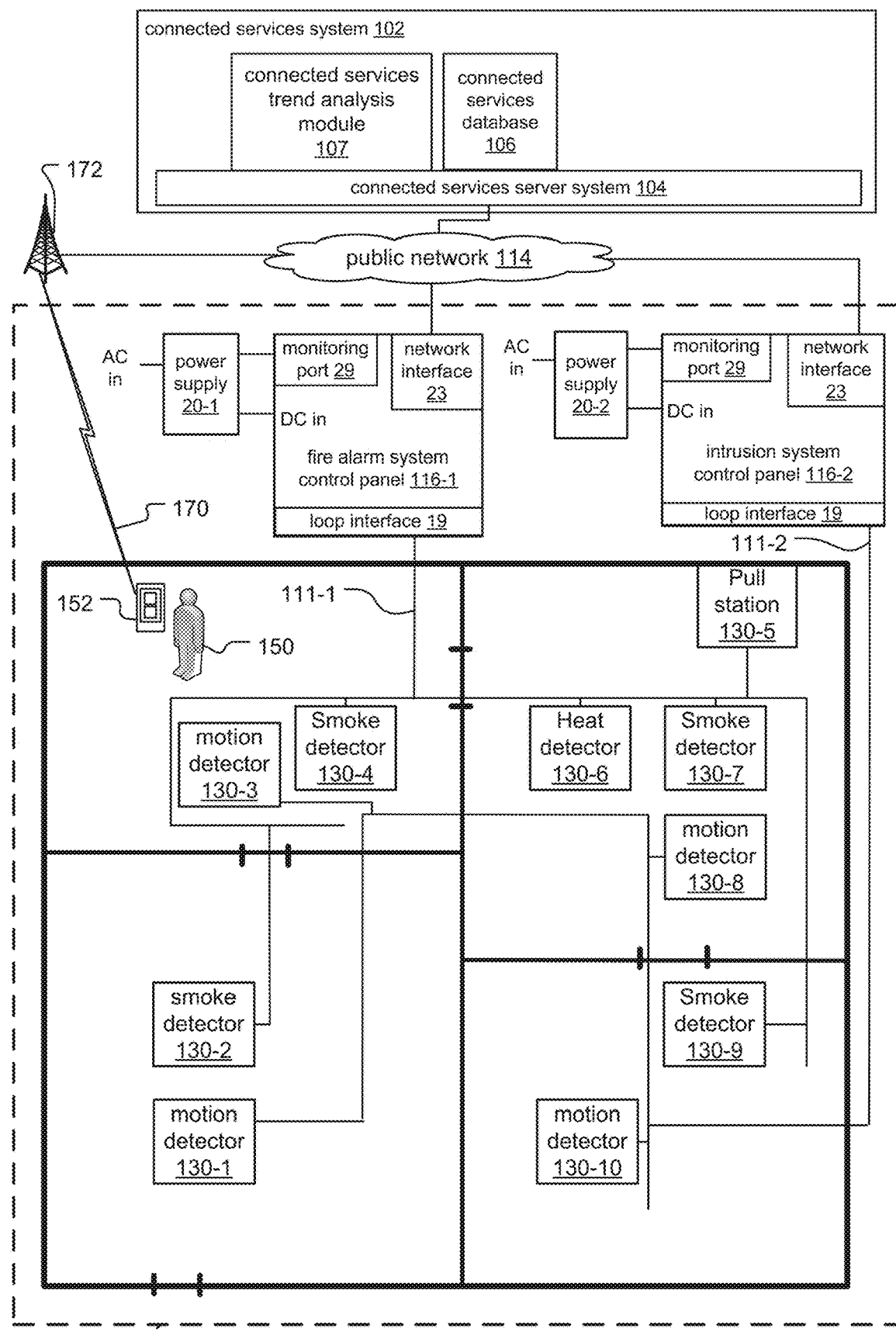
FIG. 1 is a schematic diagram showing multiple building management systems within a building, where control panels of the building management systems are powered by separate power supplies, and where the control panels communicate with a connected services system.

FIG. 1 shows two exemplary building management systems installed at a building 103. The building management systems include a fire alarm system and an intrusion system that communicate with a connected services system 102 via a public network 114.

In general, the building management systems include control panels 116 and distributed devices 130. Each control panel 116 is powered by one or more power supplies 20 that are preferably dedicated to each control panel 116. Each power supply 20 converts an AC input voltage such as an AC mains power input (e.g. 120 VAC at 50/60 Hz) into a DC output that is tailored to the power requirements of each control panel 116.

Power supplies in general have limitations. Robust power supply design is difficult. In addition, even the best designed power supplies will degrade in performance over time and eventually fail. As a result, it is common to design power supplies with a rated maximum lifetime/MTBF based on statistical analysis and redundancies.

Power supplies used in building management systems have additional considerations. Fire alarm systems for example, are high availability/reliability systems. The fire alarm system as a whole and its individual components must be monitored for any indications of foreseeable failure and/or degradation in operation. While power supplies are highly reliable components, experience has shown that building managers often use power supplies well past their typical consumer product lifetime/MTBF or beyond when replacement parts are available.

As a result, according to the present invention, these power supplies are monitored for any indications of foreseeable failure and/or degradation in operation.

In the illustrated example, each of the control panels 116 receive information concerning health of its power supplies, determined by and sent from its respective power supply 20. In the preferred embodiment, the control panels 116 monitor the received information to assess whether the power supply is at risk of imminent failure.

The connected services system 102 communicates with building management systems installed within buildings 103. The control panels 116 also forward the information concerning health of the power supplies over public network 114 to the connected services system 102. This system 102 can assess failure across many different panel power supplies based on the information reported from the panels 116. In this way, the connected services system 102 can also determine whether or not an individual power supply 20 is trending toward a failure, and/or if multiple power supplies are trending toward a failure.

In general, the panels are connected to distributed devices 130 via safety and security wired and/or wireless networks 111 of the building 103. These networks 111 support data and/or analog communication between the distributed devices 130 and the respective control panels 116. In some embodiments (not illustrated), the distributed devices 130 could all be connected to the same safety and security network 111.

In the illustrated example, distributed devices 130 of the fire alarm system are connected to a safety and security network 111-1. The network 111-1, in turn, connects to a loop interface 19 of a fire alarm system control panel 116-1. The distributed devices are slave devices of the panel 116-1. The fire alarm system control panel 116-1 also has a monitoring port 29, a network interface 23, and receives a DC input power signal from power supply 20-1.

The distributed fire alarm devices 130 include alarm initiation devices including smoke detectors 130-2, 130-4, 130-7, 130-9, heat detectors 130-6 and manually activated devices such as pull stations 130-5. The alarm initiation devices monitor the buildings for indicators of fire. Upon detection of indicators of fire, device signals are sent from the alarm initiating devices to the control panel 116-1. The device signals are typically alarm signals and/or analog values. The alarm signals are used to signal the control panel 116-1 that a fire has been detected.

Similar to the fire alarm system, distributed devices 130 of the intrusion system are connected to a second network 111-2. The second network then connects to a loop interface 19 of an intrusion system control panel 116-2. The intrusion panel 116-2 also has a monitoring port 29, a network interface 23, and receives a DC input from power supply 20-2.

The distributed intrusion devices 130 include devices for detecting the presence of unauthorized individuals in the building 103, including motion detectors 130-1, 130-3, 130-8, 130-10 and other devices (not illustrated) such as security cameras, door and window relays and network video recorders, among other examples. Upon detection of the presence of unauthorized individuals, device signals are sent from the motion detectors 130-1, 130-3, 130-8, 130-10 to the intrusion control panel 116-2.

The present system can be extended to other types of building management systems. For example, in another implementation the panel is a building automation panel such as a panel that might control building climate including HVAC.

A technician 150 is carrying a mobile computing device 152. Mobile computing devices 152 include smart phones, tablets, and other portable devices, such as devices running the Android or IOS operating systems.

The fire alarm system control panel 116-1 and intrusion system control panel 116-2 are connected to the connected services system 102 via a leased data connection, private network and/or public network 114, such as the internet. The mobile computing device 152 also connects to the public network 114 via a wireless communication link 170 to a cellular radio tower 172. The tower 172 provides access to a mobile broadband or cellular network or public and/or private wired data networks such as an enterprise network, Wi-Max, or Wi-Fi network, for example.

The control panels 116 also report information concerning health of its power supplies 20 to the mobile computing devices 152 of the technicians 150. In one example, if the information indicates that a power supply 20 is at risk of imminent failure, the control panels 116 reports this information to the mobile computing devices 152. The control panels 116 report this information to the mobile computing devices 152 over a communications path that includes the public network, tower 172, and wireless communications link 170, in one example.

The connected services system 102 is typically implemented as a cloud system. It can be run on a proprietary cloud system or implemented on one of the popular cloud systems operated by vendors such as Alphabet Inc., Amazon, Inc. (AWS), or Microsoft Corporation. As a result, the connected services system 102 typically operates on a connected services server system 104. In some cases, this server system 104 is one or more dedicated servers. In other examples, they are virtual servers.

The connected services server system 104 executes modules, including a connected services trend analysis module (trend analysis module) 107 and a connected services database 106. Each of these modules is associated with separate tasks. In some cases, these modules are discrete modules or they are combined with other modules into a unified code base. They can be running on the same server or different servers, virtualized server system, or a distributed computing system.

The connected services database 106 stores information provided by the control panels 116. The trend analysis module 107 accesses and analyzes the information stored to the database 106.

Figure 2:
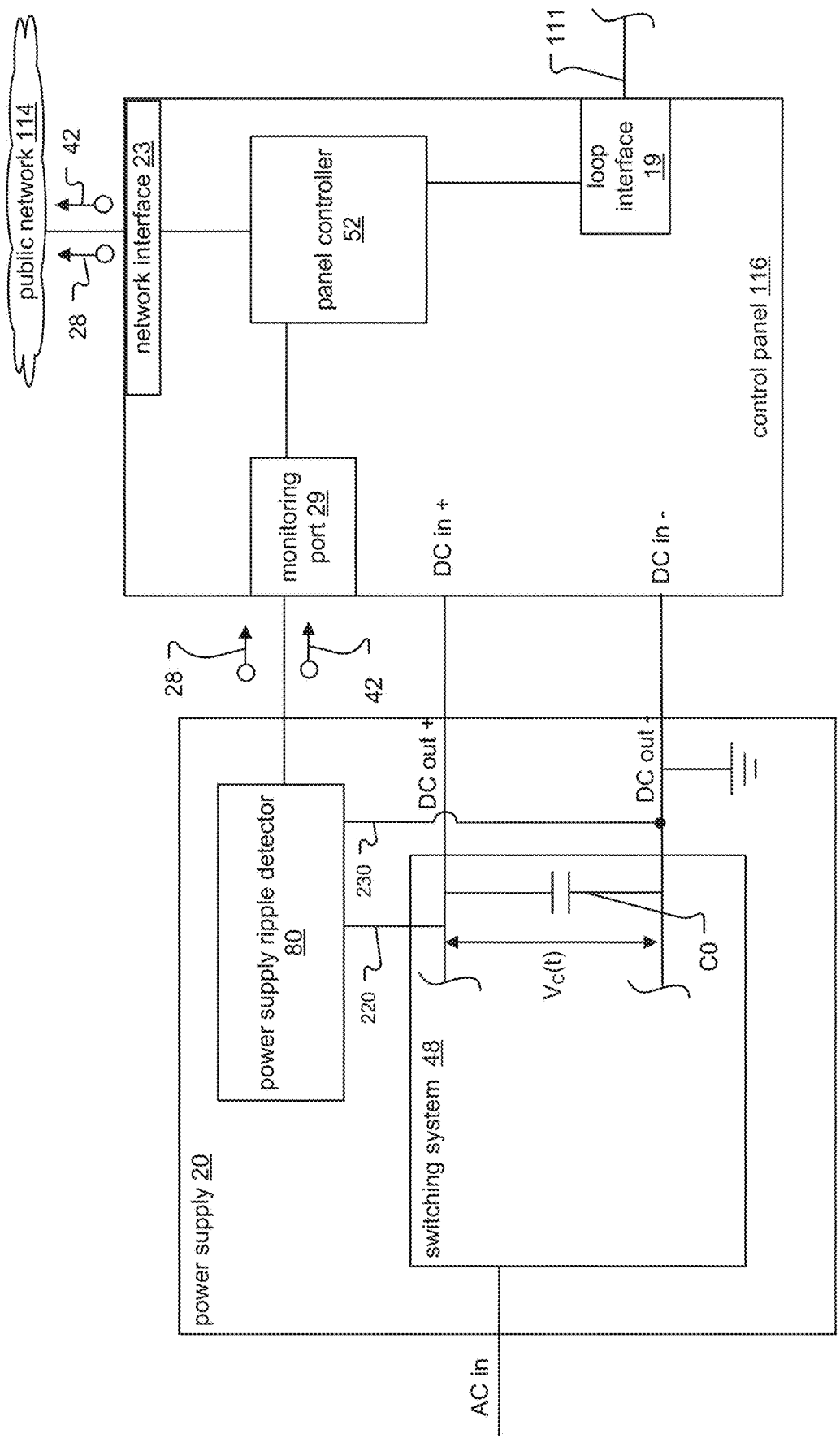
FIG. 2 is a schematic diagram showing components of a power supply and a control panel of an exemplary building management system, and also shows power and communications interfacing between the power supply and the control panel.

FIG. 2 shows a power supply 20 that provides power to an exemplary control panel 116. The power supply 20 includes a power supply ripple detector (ripple detector) 80 and a switching system 48. The control panel 116 additionally includes a panel controller 52 that controls the network interface 23, the monitoring port 29, and the loop interface 19.

There are multiple causes for power supply failure. Power supplies 20 most often fail due to improper operating conditions or misapplication of the power supplies 20. The improper operating conditions include overloading and inadequate cooling, in examples. When the power supplies are otherwise applied in a proper fashion, the most common cause of failure is the deterioration of capacitors within the power supply 20 at or near the expected lifetime/MTBF of the power supplies.

Capacitors within power supplies 20 are relied upon for their ability to alternately store and then provide electricity in quick bursts. Capacitors provide a continuous output voltage in response to a varying (i.e. alternating) input voltage. Capacitors store charge during a positive swing of the voltage input, and discharge during a negative swing of the voltage input. Capacitors continuously alternate between charging and discharging in response to the power grid's AC input voltage, which alternates at a frequency of 50/60 Hz, or in response to the much faster operating frequencies of a switching power supply.

Ripple (also known as ripple voltage) is an AC voltage component of the direct current output/DC bias of a power supply 20. The ripple voltage is typically created by one or more capacitors of the power supply that are connected across the DC output. When capacitors reach the end of their life, they provide less capacity for electricity during charging and also impede the flow of electricity during discharge. Both limitations cause the voltage across the capacitor to oscillate, or ripple, if viewed on an oscilloscope.

Ripple voltage created by capacitors in power supplies 20 can have several effects upon the power supplies. At its lowest value, the ripple voltage can cause circuits of the power supply to 'brown out.' This is because a low ripple voltage value is an indicator that the power supply 20 can no longer produce sufficient output voltage. At its highest value, the ripple voltage can cause excessive stress to components of the power supply. Excessive ripple, especially in high frequency switching supplies, can interfere with the operation of both the load on the power supply and surrounding electronics through radiated emissions. Finally, the biggest issue with excessive ripple is that it will cause higher heat in the capacitors of the power supply. Heating of the capacitors causes the capacitors to fail faster, which in turn shortens the expected lifetime of the power supply.

Returning to FIG. 2, in more detail, the switching system 48 includes a capacitor C0 located at the output of the switching system 48. Capacitor C0 connects to a positive DC output rail, labeled as DC out +, and to a negative DC output rail, labeled as DC out −. The voltage across the capacitor is labeled as Vc(t). The DC out + and DC out − rails connect to the ripple detector 80 as indicated by references 220 and 230, respectively. The DC out + rail also connects to a positive DC rail of the control panel 116, labeled as DC in +, and the DC out − rail also connects to a negative DC rail of the control panel 116, labeled as DC in −.

The power supply ripple detector 80 also provides a sampled rectified ripple signal 28 and a health signal 42 as output. The monitoring port 29 receives the signals 28/42, and the panel controller 52 forwards the signals 28/42 via network interface 23 to the public network 114. More information concerning creation and use of the sampled rectified ripple signal 28 and the health signal 42 is provided in the description of the power supply ripple detector 80 that accompanies FIG. 3, included herein below.

Within each building management system, the control panel 116 operates as a system panel for controlling the building management system. The switching system 48 of the power supply 20 forms a power supply system, and the power supply system powers the system panel. The power supply ripple detector 80 of the power supply, in turn, monitors the health of the power supply system. As a result, the ripple detector 80 also operates as a power supply health monitoring system. The power supply health monitoring system obtains information concerning health of the power supply system. The power supply health monitoring system then reports the information concerning health of the power supply system to the system panel/control panel 116.

The system panel/control panel 116, in turn, forwards the information concerning health of the power supply system to the connected services system 102. The connected services system 102 combines the information concerning health of the power supply system, with information concerning health of other power supply systems from system panels of other building management systems. The connected services system 102 stores the combined information concerning health of the power supply systems to the database 106, and the trend analysis module 107 determines trends among the combined information concerning health of the power supply systems.

Figure 3:
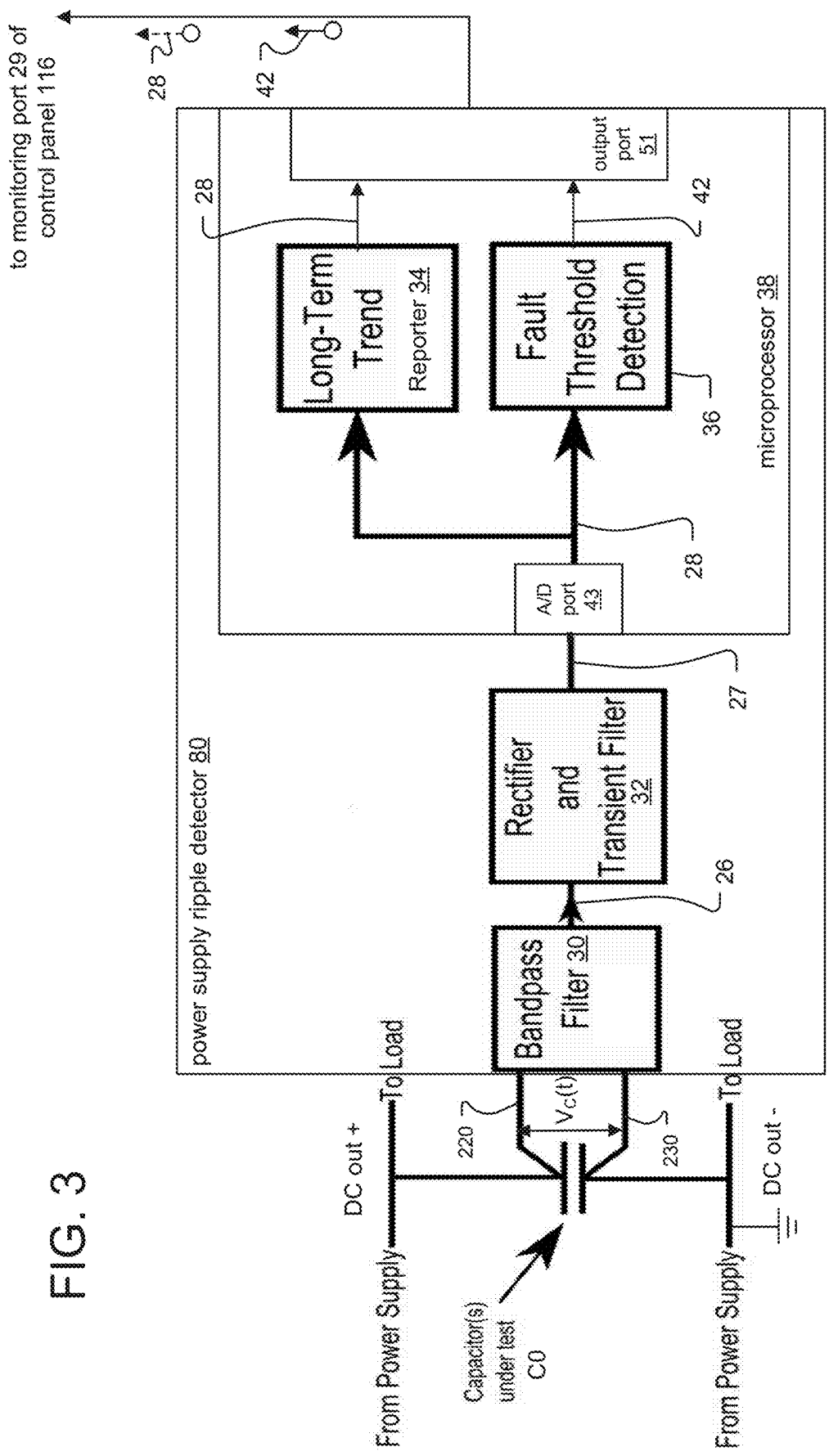
FIG. 3 is a schematic block diagram showing more detail for a power supply ripple detector of the power supply in FIG. 2.

FIG. 3 shows more detail for the ripple detector 80. The ripple detector 80 has three sequential "stages" of operation: a bandpass filter 30, a rectifier and transient filter 32, and processing executed by a microprocessor 38. The microprocessor 38 includes an Analog to Digital (A/D) port 43, a long term trend reporter module 34, a fault threshold detection module 36, and an output port 51.

In more detail, the ripple detector 80 receives the capacitor voltage Vc(t) across capacitor C0 as input. The capacitor voltage Vc(t) then enters the first stage (bandpass filter 30). The bandpass filter 30 produces a filtered ripple signal 26 from the capacitor voltage Vc(t). The bandpass filter 30 has a center frequency at an operating frequency of the power supply 20.

The second stage (rectifier and transient filter 32) transforms the oscillating waveform of the filtered ripple signal 26 into a slow, measurable output. Specifically, the rectifier and transient filter 32 converts the filtered ripple signal 26 into a rectified ripple signal 27. The rectified ripple signal 27 is an analog DC signal that represents a level of ripple of the capacitor voltage Vc(t), and therefore represents a level of ripple of the power supply 20 itself. The rectified ripple signal 27 slowly changes with time/age of the power supply 20.

The third stage (processing executed by microprocessor 38) analyzes the rectified ripple signal 27 and produces information concerning health of the power supply 20. The information concerning health of the power supply 20 is based upon the rectified ripple signal 27.

The A/D port 43 of the microprocessor 38 receives and then converts the rectified ripple signal 27 into a sampled rectified ripple signal 28. The sampled rectified ripple signal 28 is then passed to the long term trend reporter 34 and fault threshold detection 36 modules. In one implementation, the microprocessor 38 is an Application Specific Integrated Circuit (ASIC).

The long term trend reporter 34 sends the sampled rectified ripple signal 28 to the output port 51. Because the rectified ripple signal 27 slowly changes with time/age of the power supply 20, the sampled rectified ripple signal 28 also changes over time. In examples, the long term trend reporter 34 provides the sampled rectified ripple signal 28 to the output port 51 on a periodic basis, and/or when the sampled rectified ripple signal 28 has changed in value.

The fault threshold detection module 36 compares the sampled rectified ripple signal 28 to one or more acceptable/allowed threshold values for ripple voltage, and produces a health signal 42 in response to the comparison. The health signal 42 indicates whether the level of ripple of the capacitor voltage Vc(t) (and therefore whether the level of ripple of the power supply 20 itself) meets the one or more acceptable/allowed threshold values.

In one implementation, the fault threshold detection module 36 of the microprocessor 38 maintains both a minimum and a maximum allowed/acceptable threshold value for the sampled rectified ripple signal 28. When the fault threshold detection module 36 determines that the sampled rectified ripple signal 28 is within range of the minimum and maximum acceptable values, the fault threshold detection module 36 sets the health signal 42 value to be TRUE (e.g. equal to 1). This indicates that the power supply 20 is healthy/operating normally. When the sampled rectified ripple signal 28 is either below the minimum acceptable value or is above the maximum value, however, the fault threshold detection module 36 sets the health signal 42 value to be FALSE (e.g. equal to 0). This indicates that the power supply 20 is operating outside an acceptable operational state, such as when capacitors of the power supply are beginning to fail. The fault threshold detection module 36 then sends the health signal 42 to the output port 51.

As a result, the microprocessor 38 operates as a controller that analyzes the capacitor voltage Vc(t), via the bandpass filter 30, to assess a health of the power supply 20.

The microprocessor 38 then transmits information concerning the health of the power supply 20 to the control panel 116. The information concerning the health of the power supply 20 includes both the health signal 42 and the sampled rectified ripple signal 28. The microprocessor 38 transmits this information from its output port 51 to the monitoring port 29 of the control panel 116.

The control panel 116 monitors the received information concerning the health of its power supply 20 to assess the health of its power supply 20. In one example, upon receiving a health signal 42 of the information with a value of FALSE, the control panel 116 sends a message to this effect to one or more mobile computing devices 152. Technicians 150 carrying the mobile computing devices 152 can then execute actions in response, such as replacing the power supply 20.

The control panel 116 then forwards the information concerning the health of the power supply 20 (i.e. the health signal 42 and the sampled rectified ripple signal 28) to the connected services system 102 for further reporting and analysis. The connected services system 102 receives and stores the information to database 106. The trend analysis module 107 then tracks the information concerning the health of each power supply 20 over time, and also reports the analysis to mobile computing devices 152 carried by technicians 150, in examples.

The connected services system 102 also receives, stores, and analyzes information concerning the health of other power supplies 20 forwarded by other control panels 116.

Figure 4:
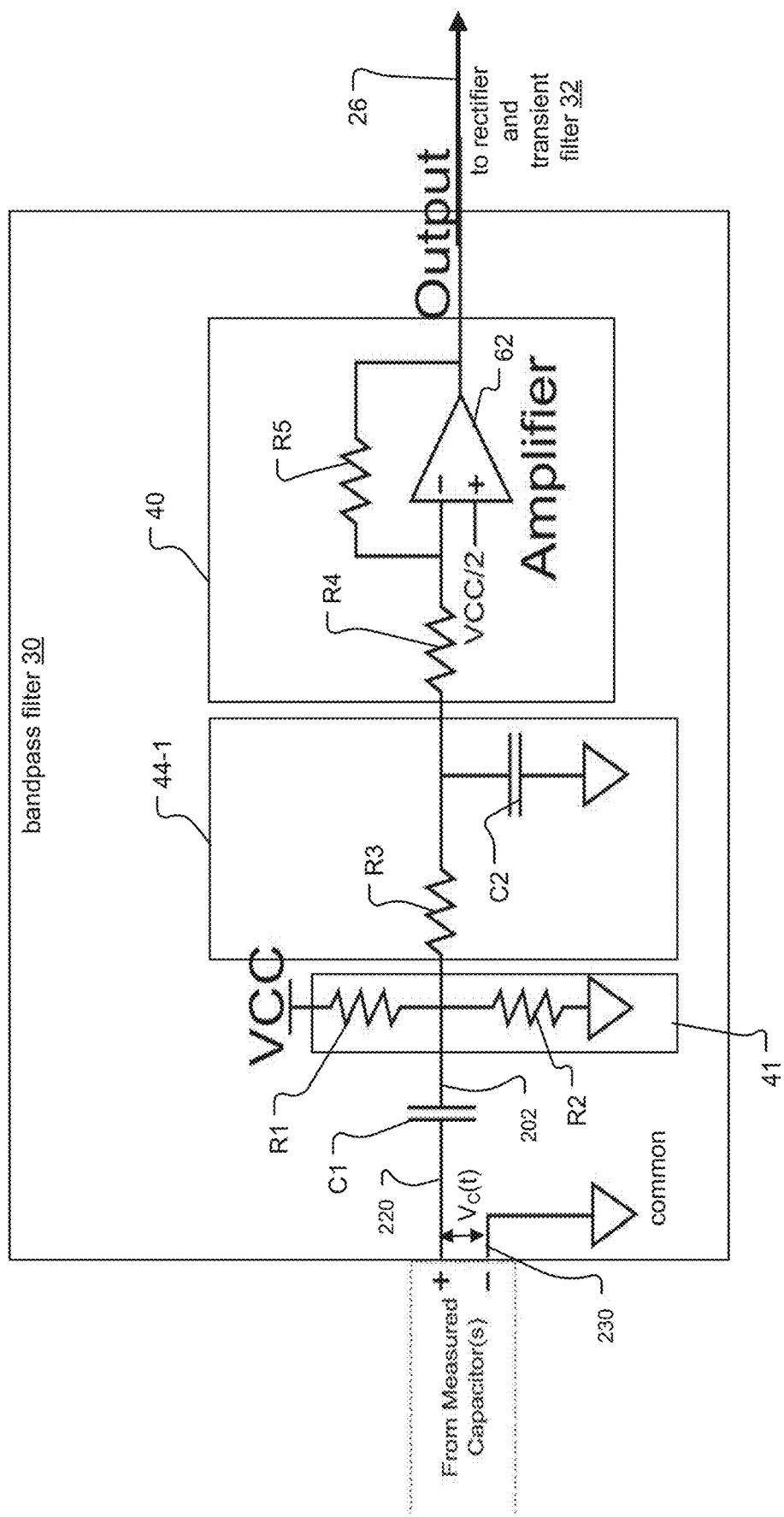
FIG. 4 is a circuit diagram for a bandpass filter of the power supply ripple detector in FIG. 3, according to an embodiment.

FIG. 4 shows detail for an embodiment of the bandpass filter 30. The bandpass filter 30 includes an input capacitor C1, a voltage divider 41, a low pass filter 44-1, and an amplifier 62. In another embodiment, the bandpass filter 30 does not include the amplifier 40. VCC is a filtered version of the DC output of the power supply 20 so that it does not impact the performance of the bandpass filter 30. Voltage divider 41 includes resistors R1 and R2. Lowpass filter 44-1 includes resistor R3 and capacitor C2.

The amplifier 40 may be included to increase the amplitude of the filtered ripple signal 26. This is because the amplitude of the ripple voltage 202 (even when it can be a problem) is usually much smaller than the amplitude of the DC bias signal. Amplifier 40 includes an op amp 62 configured as an inverting amplifier, input resistor R4, and feedback resistor R5.

The bandpass filter 30 is tuned to the operating frequency of the power supply 20. The bandpass filter 30 passes signals in a narrow band of frequencies that include the target operating frequency (or range of frequencies) of the power supply 20. The bandpass filter 30 also attenuates signals having frequencies that are above or below the target operating frequencies of the power supply 20. Because control loops for power converters are usually designed to respond much slower than the operating frequency of the power supplies, it is unlikely that a load will create a sustained ripple and cause a false-positive.

Capacitor C1 blocks a DC bias of the capacitor voltage Vc(t). C1 also passes an AC ripple voltage component of the capacitor voltage Vc(t), also known as the ripple voltage 202. Voltage divider 41 biases the ripple voltage 202 from VCC to Common to be at the center of an operating range of the amplifier 40. The biasing is required because bandpass filters are typically AC signals centered around 0V and require bipolar supplies (both positive and negative). The biasing centers the ripple voltage 202 between the DC out +/DC out − power supply rails.

Lowpass filter 44-1 attenuates transient signals within the ripple voltage 202. Without this filtering, the transient signals could otherwise cause the rectifier and transient filter 32 to produce rectified ripple signals 27 having an erroneously large amplitude. Finally, the amplifier 40 amplifies the difference between a small AC signal on capacitor C2 of lowpass filter 44-1 and a voltage mid-way between VCC and Common, and the bandpass filter 30 produces a filtered ripple signal 26 as output.

The ability of the bandpass filter 30 to pass ripple voltages at the operating frequency of power supply 20 while rejecting ripple voltages of other frequencies has an advantage. The bandpass filter 30 is sensitive to high frequency power supply ripple while rejecting all external influences on the measurement of the ripple. As a result, the bandpass filter 30 is tailored to measure only the contribution of the power supply's capacitors to the ripple, while suppressing all other external sources of influence.

Figure 5:
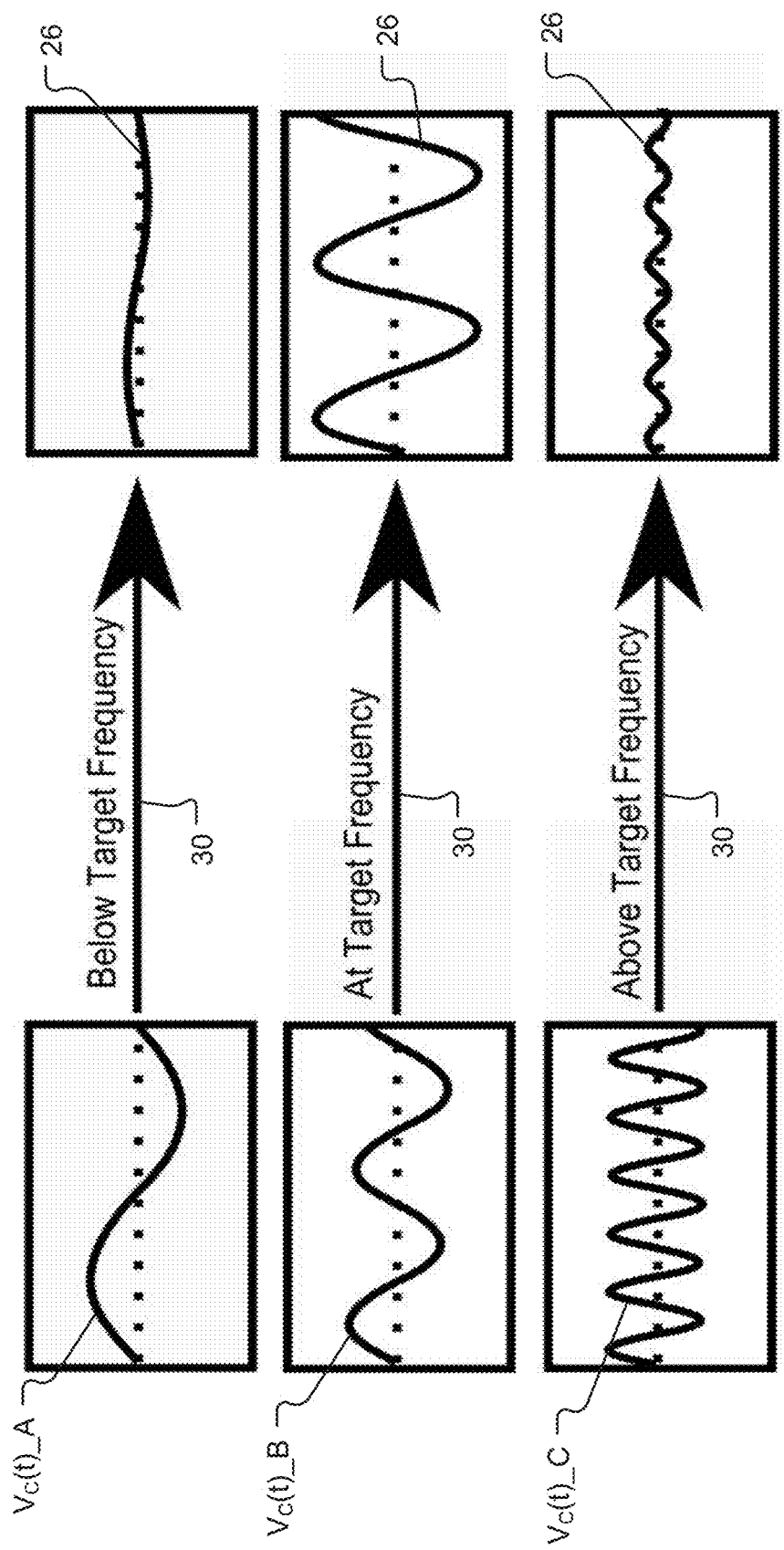
FIG. 5 shows three different plots of ripple voltage associated with a power supply on the left of the figure, where the plots show ripple voltage passed as input to the bandpass filter and respectively show ripple voltage that is below, at, and above a target frequency range of the bandpass filter, and where the figure also shows three plots of filtered ripple signals on the right that the bandpass filter provides in response.

FIG. 5 illustrates operation of the bandpass filter 30 for different capacitor voltages Vc(t). Capacitor voltages Vc(t)_A, Vc(t)_B, and Vc(t)_C are oscillating at frequencies that are below, at, and above a target frequency of the bandpass filter 30, respectively. The target frequency of the filter refers to the expected range of frequencies of the capacitor voltage Vc(t) that the bandpass filter 30 was designed to pass.

For capacitor voltages Vc(t)_A and Vc(t)_C, the filtered ripple signals 26 produced by the bandpass filter 30 are attenuated. These filtered ripple signals 26 are attenuated because the oscillating frequencies of the capacitor voltages Vc(t)_A and Vc(t)_C are respectively below and above the target frequency range of the bandpass filter 30. Because capacitor voltage Vc(t)_B has an oscillating frequency that is within the target frequency range of the bandpass filter 30, however, the bandpass filter 30 passes the filtered ripple signal 26 to the rectifier and transient filter 32 for additional processing. Here, the filtered ripple signal 26 passed by the bandpass filter 30 is also amplified (i.e. increased in amplitude) by amplifier 40, according to the embodiment of the bandpass filter 30 shown in FIG. 4.

Figure 6:
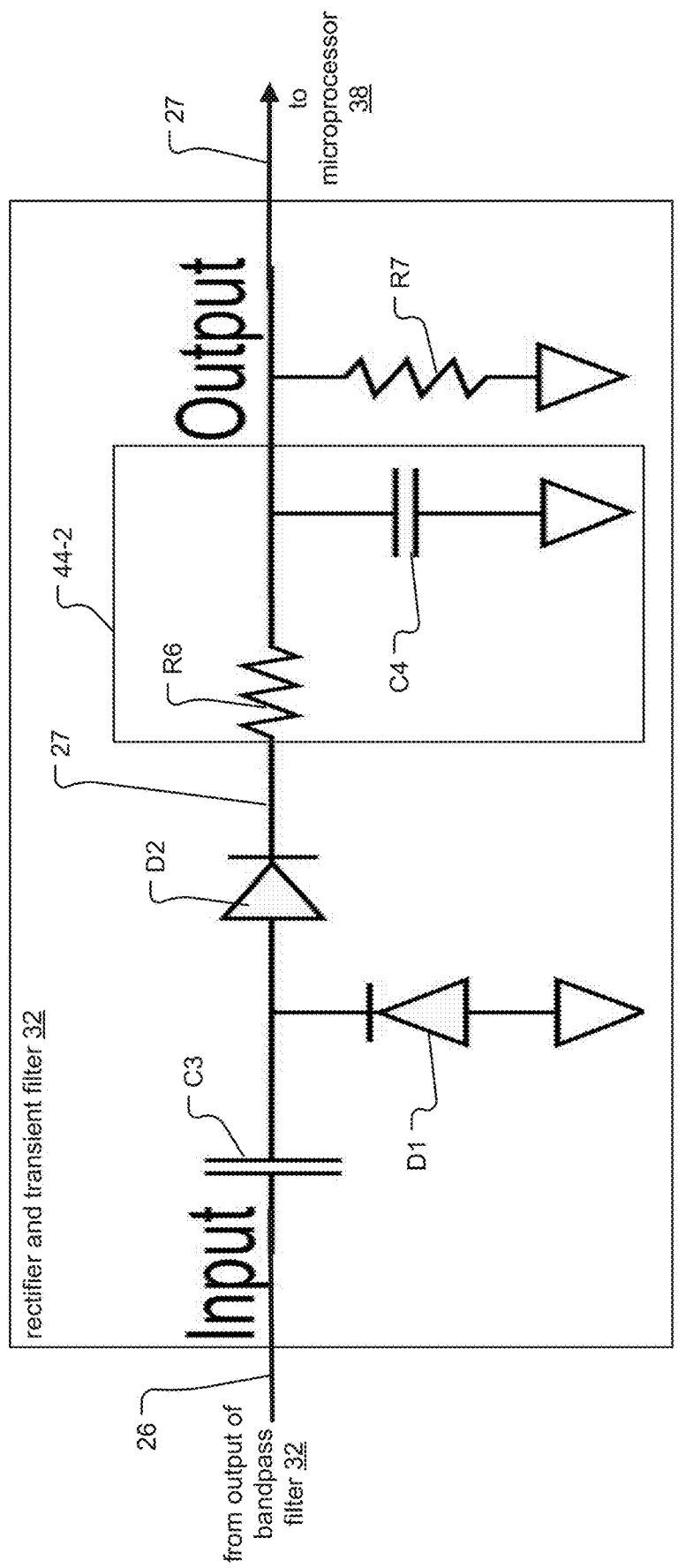
FIG. 6 is a circuit diagram for a rectifier and transient filter of the power supply ripple detector in FIG. 3.

FIG. 6 shows more detail for the rectifier and transient filter 32. The rectifier and transient filter 32 includes capacitor C3, diodes D1 and D2, lowpass filter 44-2, and output resistor R7. Lowpass filter 44-2 includes resistor R6 and capacitor C4.

Capacitor C3 removes any DC bias from the input filtered ripple signal 26. Diodes D1 and D2 sample the peaks of each cycle of the filtered ripple signal 26 and rectify the filtered ripple signal 26 into a rectified ripple signal 27. Though diodes D1 and D2 are shown, it can be appreciated that additional diodes can be included to rectify the filtered ripple signal 26 into the rectified ripple signal 27. Lowpass filter 44-2 filters (e.g. attenuates) transients and/or surges in the rectified ripple signal 27. Capacitor C4 of lowpass filter 44-2 also stores a charge between peaks of the rectified ripple signal 27. Finally, the output resistor R7 slowly discharges the rectified ripple signal 27 provided by the lowpass filter 44-2 so that the lowpass filter 44-2 does not accumulate/capture false positives such as transient events or external surges over time. The rectifier and transient filter 32 then provides the rectified ripple signal 27 as output to the microprocessor 38.

Figure 7:
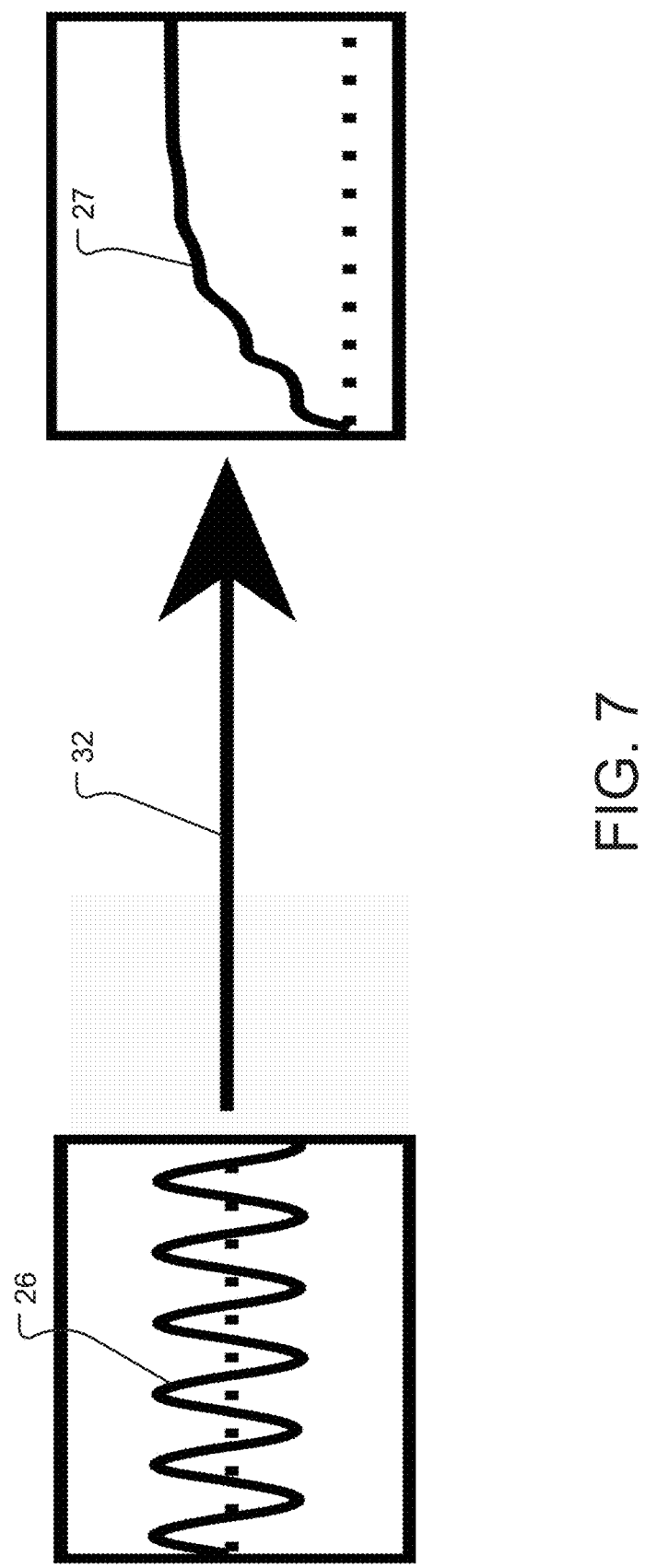
FIG. 7 shows a plot of a filtered ripple signal on the left that is passed as input to the rectifier and transient filter of FIG. 6, and also shows a rectified ripple signal on the right that the rectifier and transient filter provides in response.

FIG. 7 illustrates operation of the rectifier and transient filter 32. The rectifier and transient filter 32 converts an oscillating filtered ripple signal 26 as input into a rectified ripple signal 27 as output.

While this invention has been particularly shown and described with references to preferred embodiments thereof, it will be understood by those skilled in the art that various changes in form and details may be made therein without departing from the scope of the invention encompassed by the appended claims.

What is claimed is:

1. A power supply monitoring system, comprising:
a bandpass filter for filtering a voltage across a capacitor of a power supply of a system panel for controlling a building management system; and
a controller for analyzing the capacitor voltage via the bandpass filter to assess a health of the power supply and reporting the health to the system panel via an output port of the controller and a monitoring port of the system panel,
wherein the controller receives a filtered ripple signal via the bandpass filter and an analog to digital port of the controller, which converts the filtered ripple signal into a sampled ripple signal, and the controller analyzes the sampled ripple signal, produces information concerning the health of the power supply based on the sampled ripple signal, and reports the health to the system panel by outputting the sampled ripple signal and a health signal via the output port of the controller to the monitoring port of the system panel.

2. The system of claim 1, wherein the bandpass filter has a center frequency at an operating frequency of the power supply.

3. The system of claim 1, wherein the bandpass filter includes a first capacitor that blocks a DC bias of the capacitor voltage and passes an AC ripple voltage component of the capacitor voltage.

4. The system of claim 1, wherein the bandpass filter produces a filtered ripple signal.

5. The system of claim 4, wherein the bandpass filter additionally amplifies the filtered ripple signal.

6. The system of claim 1, wherein the bandpass filter includes a voltage divider and an amplifier.

7. The system of claim 6, wherein the voltage divider biases an AC ripple voltage component of the capacitor voltage to be at a center of an operating range of the amplifier.

8. The system of claim 1, further comprising a rectifier and transient filter that receives a filtered ripple signal provided by the bandpass filter, and outputs a rectified ripple signal.

9. The system of claim 8, wherein the rectifier and transient filter includes two or more diodes.

10. The system of claim 8, wherein the rectifier and transient filter additionally includes a low pass filter that filters the rectified ripple signal to attenuate transients and/or surges within the rectified ripple signal.

11. The system of claim 1, wherein the controller analyzes the capacitor voltage via the bandpass filter to assess a health of the power supply, based upon a rectified ripple signal.

12. The system of claim 1, wherein the controller determines that the power supply is operating outside an acceptable operational state when a sampled rectified ripple signal is lower than a minimum threshold value and/or higher than a maximum threshold value.

13. The system of claim 1, further comprising:
a connected services system that communicates with the system panel over a network;
wherein the system panel forwards the information concerning health of the power supply system, reported by the power supply health monitoring system, to the connected services system.

14. The system of claim 13, wherein the building management system is a fire alarm system and the system panel is a fire alarm system control panel.

15. The system of claim 13, wherein the system panel reports the information concerning health of the power supply system to a mobile computing device carried by a technician.

16. The system of claim 1, wherein a long term trend reporter of the controller sends the sampled ripple signal to the output port on a periodic basis and/or when the sampled ripple signal has changed in value.

17. The system of claim 1, wherein a fault threshold detection module of the controller produces the health signal based on a comparison of the sampled ripple signal to one or more acceptable or allowed threshold values for ripple voltage, the health signal indicating whether the level of ripple meets the one or more acceptable or allowed threshold values, and sends the health signal to the output port.

18. The system of claim 1, wherein system panel monitors the health signal to assess the health of its power supply.

19. The system of claim 18, wherein, in response to receiving a health signal with a value of false, the system panel sends a message to one or more mobile computing devices carried by technicians.

20. A power supply monitoring method, the method comprising:
filtering a voltage across a capacitor of a power supply to obtain a filtered ripple signal, the power supply powering a system panel for controlling a building management system;
rectifying the filtered ripple signal to obtain a rectified ripple signal that represents a level of ripple of the capacitor voltage;
receiving the rectified ripple signal via an analog to digital port of a controller and converting the rectified ripple signal into a sampled ripple signal;
analyzing the sampled ripple signal to assess a health of the power supply and producing information concerning the health of the power supply based on the sampled ripple signal; and
reporting the health to the system panel by outputting the sampled ripple signal and a health signal via an output port of the controller and a monitoring port of the system panel.

21. A power supply monitoring system, comprising:
a bandpass filter for filtering a voltage across a capacitor of a power supply of a system panel for controlling a building management system;
a controller for analyzing the capacitor voltage via the bandpass filter to assess a health of the power supply and reporting the health to the system panel via an output port of the controller and a monitoring port of the system panel; and
a connected services system that communicates with the system panel over a network,
wherein the system panel forwards the information concerning health of the power supply system, reported by the power supply health monitoring system, to the connected services system, and the connected services system combines the information concerning health of the power supply system, with information concerning health of other power supply systems from system panels of other building management systems, and determines trends among the combined information concerning health of the power supply systems.

22. A power supply monitoring system, comprising:
a bandpass filter for filtering a voltage across a capacitor of a power supply of a system panel for controlling a building management system;
a controller for analyzing the capacitor voltage via the bandpass filter to assess a health of the power supply and reporting the health to the system panel via an output port of the controller and a monitoring port of the system panel,
wherein the controller receives a filtered ripple signal via the bandpass filter and an analog to digital port of the controller, which converts the filtered ripple signal into a sampled ripple signal; and
a rectifier and transient filter that receives the filtered ripple signal provided by the bandpass filter and outputs a rectified ripple signal to the controller by transforming an oscillating waveform of the filtered ripple signal from the bandpass filter into a slow, measurable output that represents a level of ripple of the voltage across the capacitor and represents a level of ripple of the power supply, wherein the controller receives the rectified ripple signal via the analog to digital port of the controller, and the analog to digital port converts the rectified ripple signal into the sampled ripple signal.

* * * * *